United States Patent [19]
Chrysler et al.

[11] Patent Number: 5,825,620
[45] Date of Patent: Oct. 20, 1998

[54] ENHANCED AIR COOLING SYSTEM WITH ATTACHED COOLING UNIT

[75] Inventors: Gregory Martin Chrysler; Richard Chao-Fan Chu, both of Poughkeepsie, N.Y.

[73] Assignee: International Business Machines Corporation, Armonk, N.Y.

[21] Appl. No.: 769,607

[22] Filed: Dec. 18, 1996

[51] Int. Cl.$^6$ .................................................. H05K 7/20
[52] U.S. Cl. ............................................................ 361/695
[58] Field of Search ................................ 361/688–697, 361/724, 796

[56] References Cited

U.S. PATENT DOCUMENTS

| | | |
|---|---|---|
| 4,093,021 | 6/1978 | Groom . |
| 4,489,363 | 12/1984 | Goldberg . |
| 5,027,254 | 6/1991 | Corfits et al. ............................ 361/694 |
| 5,040,095 | 8/1991 | Beaty et al. . |
| 5,216,579 | 6/1993 | Basara et al. . |
| 5,419,679 | 5/1995 | Gaunt et al. . |

*Primary Examiner*—Gregory D. Thompson
*Attorney, Agent, or Firm*—Lawrence D. Cutter

[57] ABSTRACT

A method and apparatus which provide field upgradability of an electrical system's air cooling capacity is provided. In particular, air-moving devices are disposed in an external enclosure which is mated with a base unit in such a way as to convert one of the base unit's exhaust ports to an added inlet port. Accordingly, thermal upgradability in the field is easily provided by removing lower capacity interior blowers, by providing and using an access port into the middle of the old air flow path and by attaching an exterior unit having increased air-moving capacity.

5 Claims, 2 Drawing Sheets

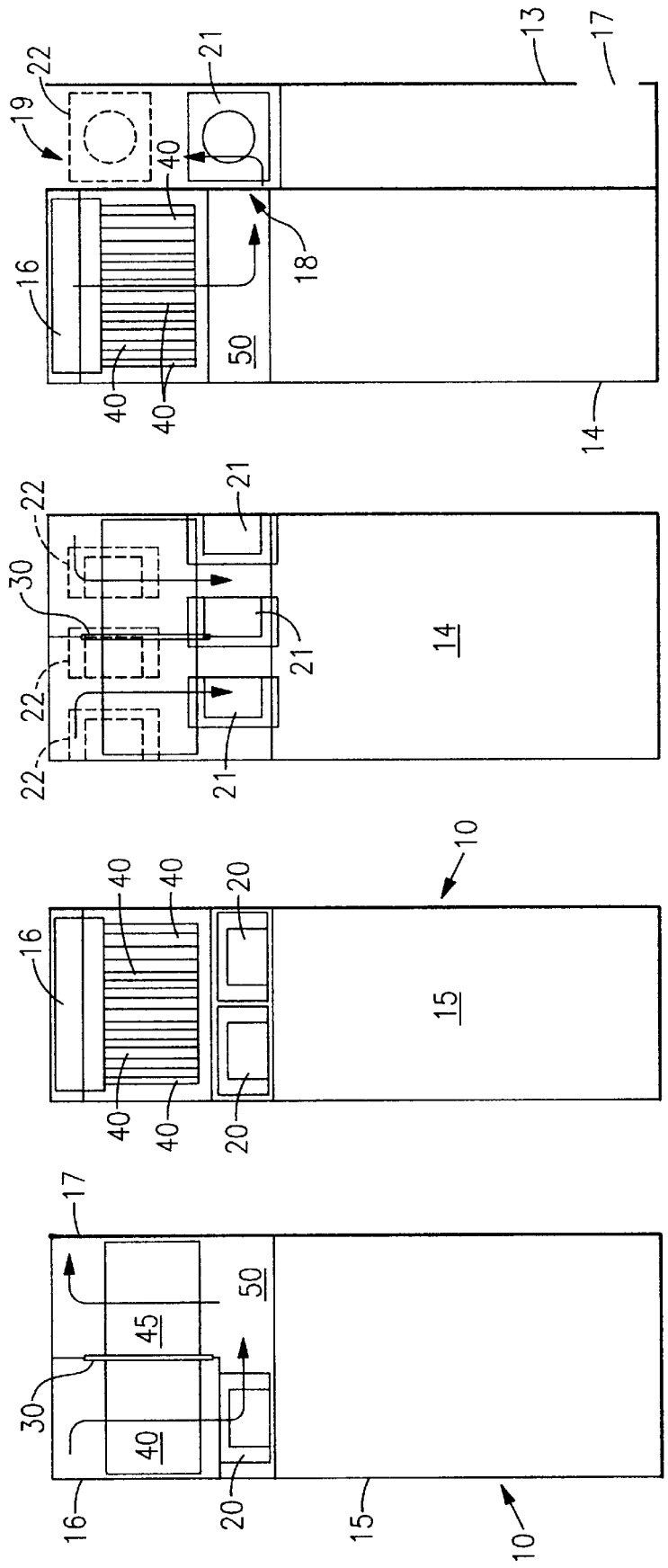

ENHANCED AIR COOLING SYSTEM WITH ATTACHED COOLING UNIT

BACKGROUND OF THE INVENTION

The present invention is generally directed to air cooling systems for electronic equipment. More particularly, the present invention is directed to a method and apparatus which enable air-cooled electrical systems to be upgraded in the field in ways which increase their power demands and concomitant heat generation capability while at the same time providing increased cooling capacity. Even more particularly, the present invention enables field upgradability of air cooled computer systems when higher computing power and/or higher power dissipation cards or modules are added to the system.

In one computer system design of interest herein, printed circuit cards are affixed to two sides of a planar circuit board. These electronic components are contained within a cabinet or housing which has an inlet and an exhaust for the passage of cooling air. Also provided in the cabinet is a blower (or more generally, an air-moving device (AMD)) which draws air in through the inlet, through a first set of spaced-apart printed circuit cards, through the blower itself and thence, through a second set of spaced-apart printed circuit cards before the heated air passes to the exhaust vent or port. Such systems are said to operate in a push/pull mode. In this design, the blower is located in the center of the cooling air flow path which is contained entirely within the original housing. In this design, the air that passes over the first set of electronic printed circuit cards on the inlet side is heated and, thus, the air that passes over the second set of printed circuit cards has already been, at least somewhat, preheated. Since thermodynamic heat transfer depends on temperature differences, it is therefore seen that the heat removal capacity for the second set of printed circuit cards is reduced. Depending upon the power dissipation of the electronic components employed in the system, this is often a perfectly satisfactory arrangement.

However, the present invention is particularly directed to situations in which one wishes to increase the power dissipation of the electronic circuit components. While the present invention is directed to a wide variety of electrical and electronic systems, it is noted that it is particularly applicable to computer systems. For example, in computer systems, it is not uncommon to provide mechanisms for increasing the level of computational power provided in the system. The computational power increase is typically provided in one of several ways. In one mechanism, internal computer clock speeds are increased in frequency. This factor alone results in increased power generation by the components in the computer system. Additionally, more processor units may be included in the computer system. This, also, raises the level of power generation which results in increased heat loading which must be compensated for in order to provide desirable levels of reliability and availability.

Various mechanisms for increasing the heat removal capacity of an air-cooled system include providing either more blowers, more powerful blowers or increasing the power to the air-moving devices which drive the air cooling system. However, all of these methods do result in increased system noise, or at least have the capability of doing so. Additionally, it may not be possible to include larger AMDs within the originally provided housing.

Since it is often possible to upgrade electrical and/or electronic computer systems in the field via the mechanism of adding additional modules or by replacing modules with more powerful modules, it is also very highly desirable to be able to upgrade the air-cooling capacity of the system at the same time and in the same manner, that is, by means of an upgrade which occurs in the field.

SUMMARY OF THE INVENTION

In accordance with a preferred embodiment of the present invention, an electrical system which is adaptable to receive an attached cooling unit comprises: a two-sided planar circuit board; a plurality of circuit boards plugged into both sides of the planar board; a cabinet which encloses the planar circuit board and the circuit cards and wherein the cabinet has an air inlet port and an air exhaust port. The system also includes a removable air-moving device disposed within the cabinet in a central location along the air flow path between the inlet and outlet ports. The electrical system achieves adaptability by providing a means for accessing the interior of the cabinet at a point along the air flow path which is downstream of the air-moving device and which is also upstream of a second set of printed circuit cards which is downstream of the air-moving device.

In accordance with the present invention, an access opening to the interior volume provides an opportunity for attaching an external unit into which the air-moving devices now reside. Thus, in accordance with the present invention, field adaptability is provided first of all by creating access to the flow path at a point which is immediately downstream of the location from which the original air-moving device was removed. The attached cooling unit comprises an enclosure which is distinct from the cabinet and which has an air flow path which is in flow communication with a plenum from which the air-moving device was removed during the upgrade operation. The enclosure for the attached cooling unit also has an air exhaust port and includes at least one air-moving device which draws air in from the access port in the cabinet and exhausts it into the room. Thus, what was formerly an exhaust port for the cabinet now becomes a second inlet port. This alone enhances heat removal capacity. In this way, all printed circuit cards now receive cooling air at the same temperature, which is in fact a temperature which is lower with respect to the temperature "seen" by the formerly downstream set of printed circuit cards.

In preferred embodiments of the present invention, access is provided to an interior plenum region which is downstream of the air-moving device. This is provided either by replacing the entire cabinet with a cabinet which has an opening in a location which is suitable for this access or by providing a cabinet which has a removable panel which is replaced by a panel with an appropriately sized and positioned opening. Alternatively, the cabinet or a side panel of the cabinet may be provided with an opening with a removable door which normally covers the access opening. Lastly, and for the most part least preferably, it is also possible to cut a hole in the side of a cabinet or cabinet side panel to provide an appropriate access opening.

Once an access opening is provided and the original air-moving device is removed from the interior of the cabinet, it then becomes a simple matter of positioning an auxiliary cooling unit along side of the original machine. Although certainly preferable, it is not always necessary to remove all internal AMDs.

Accordingly, it is an object of the present invention to make it possible to upgrade a cooling system in the field.

It is also an object of the present invention to provide an adaptable cooling system for electrical, electronic and computer equipment.

It is yet another object of the present invention to provide a mechanism for the easier replacement of circuit modules and cards with higher powered entities while at the same time providing a mechanism for upgrading the air cooling system used with the original apparatus.

It is also an object of the present invention to provide a mechanism for noise reduction.

It is a still further object of the present invention to provide an auxiliary and adaptable cooling system in which air-moving devices may be cascaded in a serial fashion to produce a greater pressure drop.

It is also an object of the present invention to provide more thermally balanced heat removal systems and flow paths.

It is a still further object of the present invention to provide greater air flow and/or pressure drop in an electronic system to be cooled.

It is also an object of the present invention to be able to employ larger blowers or other air-moving devices rather than have these devices limited to the sizes determined by interior volumes of the computer or electronic systems to be cooled.

It is another object of the present invention to provide a mechanism in an auxiliary cooling unit which enables the election of the direction of warm air exhaust, namely, either at a location near the floor of the unit or at a location near the top of the unit.

It is yet another object of the present invention to provide extra volume in the flow path so that acoustic noise treatment mechanisms may be employed.

Lastly, but not limited hereto, it is an object of the present invention to provide a mechanism for the field upgrade of the capacity of an air cooling system for electronic computers or other electrical apparatus.

BRIEF DESCRIPTION OF THE DRAWINGS

The subject matter which is regarded as the invention is particularly pointed outward distinctly claimed in the concluding portion of the specification. The invention, however, both as to organization and method of practice, together with the further objects and advantages thereof, may best be understood by reference to the following description taken in connection with the accompanying drawings in which:

FIG. 1A is a partially wire frame side elevation view of a computer or electronic system design which is not adaptable and which employs interiorly disposed air-moving devices;

FIG. 1B is a front elevation wire frame view of the system design shown in FIG. 1A;

FIG. 2A is a view similar to FIG. 1A except more particularly illustrating the presence of an auxiliary or attachable cooling unit;

FIG. 2B is a front view of the system shown in FIG. 2A which elaborates on the relationship between the original cabinet and the attachable unit.

DETAILED DESCRIPTION OF THE INVENTION

Figure 3:
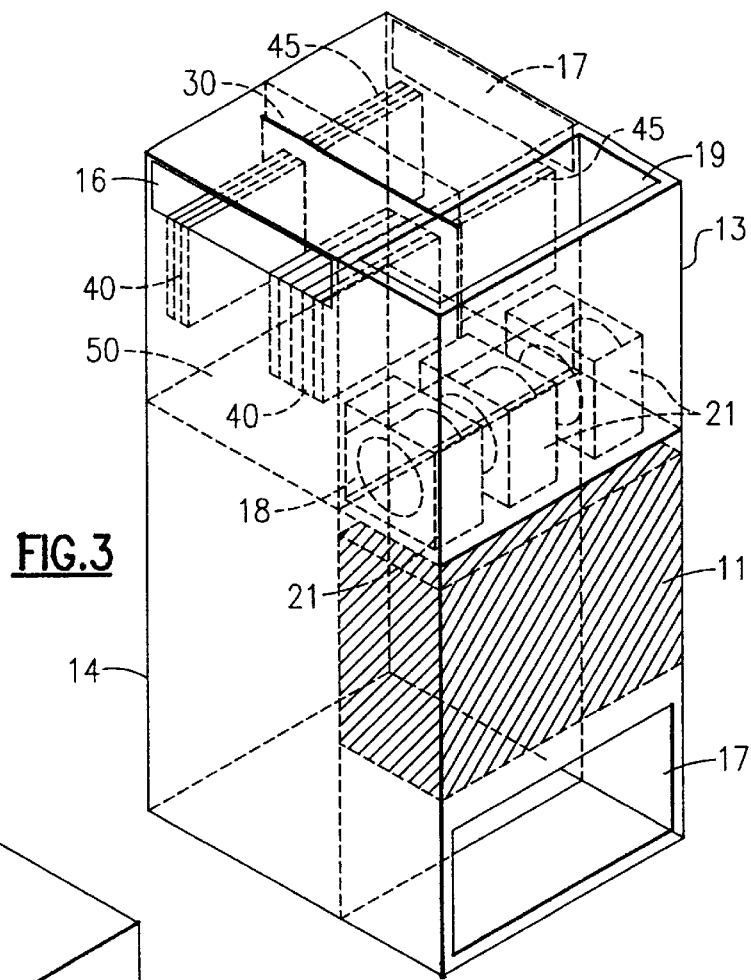
FIG. 3 is a wire frame isometric view illustrating one embodiment of the present invention.

In one design of a computer or other electronic system 10, as shown in FIG. 1A, it is seen that cabinet 15 includes printed circuit board 30 into which printed circuit cards 40 and 45 are inserted on opposite sides thereof. At the top of cabinet 15, there is provided inlet port 16 and, on the opposite side, exhaust port 17. Air-moving devices 20 are disposed within plenum 50 which lies below printed circuit card sets 40 and 45. Air-moving devices 20 draw air into inlet port 16, through spaced-apart printed circuit cards 40, through air-moving device 20 itself, out to a portion of plenum 50 and thence, through a second set of spaced-apart printed cards which are meant to be cooled. This is disadvantageous in that the air that passes over printed circuit cards 45 has already been heated up during its passage across cards 40. This is a disadvantage of the design shown in FIGS. 1A and 1B. Additionally, the size of the air-moving device, such as a blower, is constrained by internal cabinet dimensions. This is illustrated, at least in part, in FIG. 1B where it is shown that the internal plenum portion of cabinet 15 is limited in size and is capable of containing only two blowers 20 (or other air-moving devices) Preferred embodiments of the present invention employ blowers 20 of the squirrel-cage variety.

It is thus seen that the design illustrated in FIGS. 1A and 1B shows the presence of an interior air flow path which includes inlet port 16, the space between printed circuit cards 40, air-moving devices 20, plenum 50, the spaces between printed circuit cards 45 and exhaust port 17. It is the presence of air-moving device 20 in the central portion of this flow path that leads one to refer to the design shown as being of the push/pull variety.

It is noted that printed circuit cards 40 may also include electric or electronic power modules. In particular, printed circuit cards 40 are pluggable into circuit board 30 which is typically a planar board, mother board or back plane. The essential feature of printed circuit cards 40 and 45 is that they are pluggable into planar board 30 and are removable therefrom and that they generate heat which is to be removed.

Figure 4:
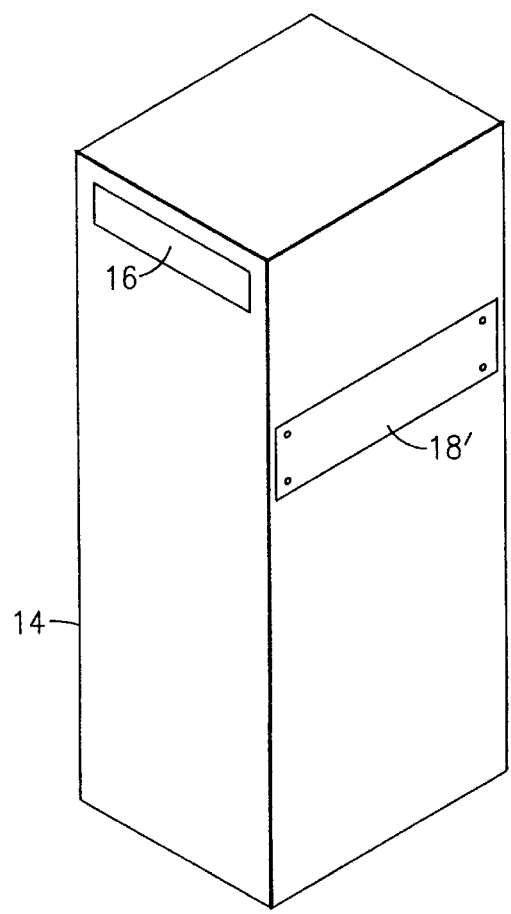
FIG. 4 illustrates a removable door.

In accordance with a preferred embodiment of the present invention, a mechanism and system are provided for upgrading the cooling capacity of a system having the design shown in FIGS. 1A and 1B. In particular, in a first step in the upgrade process, air-moving devices 20 are removed from plenum 50 and opening 18 is provided in the side of cabinet 15. This opening 18 may be provided by cabinet substitution, by substituting a side wall of the cabinet or by removing a temporary door 18 sized and positioned to have access to plenum 50 (see FIG. 4).

To provide the desired enhanced cooling, an attachable cooling unit is preferably positioned next to cabinet 15. The attachable cooling unit includes enclosure 13 which can now contain a larger number of air-moving devices 21 or, in fact, physically larger air-moving devices. With the positioning of air-moving devices 21 in enclosure 13, blower size constraints are thus effectively eliminated. It is noted that auxiliary blower enclosure 13 includes either exhaust 17 near the bottom of the unit or exhaust outlet 19 near the top of the unit, or both. It is also noted that the use of exterior enclosure 13 provides a mechanism for cascading blowers 21 and 22 so as to provide a greater pressure drop in those critical thermal dissipation situations in which it is needed or desired. Accordingly, blowers 22 are optional.

An important part of the present invention is the presence of access port opening or means 18 in cabinet 15 which is referred to as reference numeral 14 in FIGS. 2 and 3. It is also to be particularly noted that former exhaust port 17 is now an inlet port. Access means 18 provides direct access to plenum 50 which lies along the central lengths of the air flow cooling path. It is thus seen that air-moving devices 21 now cause a relatively uniform temperature air flow across printed circuit cards 40 and 45. It is also noted that attached cooling unit enclosure 13 is illustrated as extending from the floor to the top of cabinet 14. This need not be the case. However, the dimensions of enclosure 13 shown are considered to be the most aesthetically pleasing.

The present invention is also illustrated in somewhat different detail in FIG. 3 which is an isometric wire frame view showing the attachable cooling unit in a side-by-side relationship to the original system. FIG. 3 also illustrates the fact that enclosure 13 can also include, in its interior volume, acoustic treatment 11 which might comprise sound deadening baffles and/or sound absorptive materials to reduce exterior emissions of acoustic noise that might be associated with the auxiliary cooling unit. It is also noted that this unit includes exhaust openings 17 and 19. At least one of these exhaust openings must be present. However, it is possible to employ an attachable unit which has two such openings. Likewise, the choice of a bottom or top opening is typically determined by the environment in which the unit is working. Other exhaust locations associated with the attachable cooling unit may also be provided without departing from the teachings or scope of the present invention.

Accordingly, it is seen that the attached cooling unit in enclosure 13 is a field-installable attachment which is capable of providing upgraded air cooling capacity for computers or other devices which have themselves been upgraded to higher performance characteristics which in turn impose higher thermal demands. This system allows the user simply to replace and/or add circuit cards, modules or so-called "books" until the cooling requirements of the system exceed the capacity of the air-moving devices employed. At that point, the attached cooling unit, as described herein, is installed, thus providing a parallel upgrade path for the electronic and, simultaneously, the thermal components of the system.

While the invention, as described above, has been directed to the situation in which a two-sided board has spaced-apart printed circuit cards located on both sides, it is also possible to employ the techniques of the present invention in situations in which printed circuit cards are disposed on only a single side of a board (e.g., a back plane or mother board). Even though these situations do not necessarily result in the conversion of an exhaust port into an inlet port, conversions and enhancements of the kind described herein are nonetheless very desirable and productive when increased cooling requirements need to be addressed. In such cases, the addition of an exterior unit having greater air-moving capacity greatly enhances the ability to match the increased cooling needs with an appropriately sized and configured set of blowers.

From the above, it should be appreciated that the invention described herein fully and completely describes a system which is capable of achieving all of the objectives set forth above.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An electrical system adaptable to receive an attachable cooling unit, said system comprising:

a two-sided planar circuit board;

a plurality of circuit cards plugged into a first side and a second side of said planar circuit board;

a cabinet enclosing said planar circuit board and said plurality of circuit cards, said cabinet having an air inlet port and an air exhaust port;

a removable air-moving device disposed within said cabinet in an air flow path which includes sequentially: said air inlet port, said printed circuit cards on said first side of said planar circuit board, said air-moving device, said printed circuit cards on said second side of said planar circuit board and said air exhaust port; and opening means in said cabinet for providing access to the interior of said cabinet at a point along said air flow path downstream of said air moving device and upstream of said printed circuit cards on said second side of said planar circuit board.

2. The system of claim 1 in which said means for providing access includes a removable side panel in said cabinet which side panel may be replaced with a panel with an access hole therein.

3. The system of claim 1 in which said means for providing access includes a side panel, in said cabinet, having a removable door therein.

4. The system of claim 1 in which said air moving device is a blower.

5. An electrical system adaptable to receive an attachable cooling unit, said system comprising:

a planar circuit board;

a plurality of circuit cards plugged into a first side of said planar circuit board;

a cabinet enclosing said planar circuit board and said plurality of circuit cards, said cabinet having an air inlet port and an air exhaust port;

a removable air-moving device disposed within said cabinet in an air flow path which includes sequentially: said air inlet port, said printed circuit cards on said first side of said planar circuit board, said air-moving device and said air exhaust port; and opening means in said cabinet for providing access to the interior of said cabinet at a point along said air flow path downstream of said air-moving device and upstream of exhaust port.

* * * * *